(12) United States Patent
Harigai et al.

(10) Patent No.: US 8,539,173 B2
(45) Date of Patent: Sep. 17, 2013

(54) MEMORY DEVICE, MEMORY SYSTEM AND MICROCONTROLLER INCLUDING MEMORY DEVICE, AND MEMORY CONTROL DEVICE

(75) Inventors: Hisao Harigai, Kanagawa (JP); Toshihide Tsuboi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 297 days.

(21) Appl. No.: 13/072,262

(22) Filed: Mar. 25, 2011

(65) Prior Publication Data
US 2011/0238931 A1    Sep. 29, 2011

(30) Foreign Application Priority Data
Mar. 29, 2010    (JP) .................................. 2010-074430

(51) Int. Cl.
*G06F 12/00*    (2006.01)
*G11C 8/00*    (2006.01)
*G11C 7/00*    (2006.01)

(52) U.S. Cl.
USPC ................. 711/154; 365/189.15; 365/230.01; 711/E12.001

(58) Field of Classification Search
USPC .................... 711/154, E12.001; 365/230.01, 365/189.15
See application file for complete search history.

(56) References Cited

U.S. PATENT DOCUMENTS

| | | | | |
|---|---|---|---|---|
| 7,269,090 B2* | 9/2007 | Baker et al. | ............. | 365/230.06 |
| 7,570,541 B2* | 8/2009 | Ikeda et al. | ............. | 365/230.06 |
| 2005/0141328 A1* | 6/2005 | Nagai et al. | ............. | 365/230.06 |
| 2007/0183197 A1* | 8/2007 | Park et al. | ................ | 365/185.03 |

FOREIGN PATENT DOCUMENTS

| | | |
|---|---|---|
| JP | 63-308783 A | 12/1988 |
| JP | 03-044748 A | 2/1991 |
| JP | 04-359334 A | 12/1992 |
| JP | 05-073406 A | 3/1993 |
| JP | 05-127985 A | 5/1993 |
| JP | 2003-123477 A | 4/2003 |

OTHER PUBLICATIONS

Communication, dated Mar. 19, 2013, issued by the Japanese Patent Office in counterpart Japanese Patent Application No. 2010-074430.

* cited by examiner

*Primary Examiner* — Hoai V Ho
*Assistant Examiner* — Tri Hoang
(74) *Attorney, Agent, or Firm* — Sughrue Mion, PLLC

(57) ABSTRACT

A memory device includes: a plurality of word lines and bit lines specifying addresses to be accessed; and a plurality of memory cells of consecutive addresses arranged to correspond to each of the word lines. The plurality of memory cells of the consecutive addresses are accessible in parallel by the plurality of bit lines each corresponding to one of the memory cells. Among the plurality of word lines, a first word line and a second word line that specifies an address next to that of the first word line have an overlapping address range, and a first memory cell connected to the first word line and a second memory cell connected to the second word line are assigned in dual fashion to a same address.

2 Claims, 8 Drawing Sheets

MEMORY DEVICE, MEMORY SYSTEM AND MICROCONTROLLER INCLUDING MEMORY DEVICE, AND MEMORY CONTROL DEVICE

REFERENCE TO RELATED APPLICATION

This application is based upon and claims the benefit of the priority of Japanese patent application No. 2010-074430, filed on Mar. 29, 2010, the disclosure of which is incorporated herein in its entirety by reference thereto.

TECHNICAL FIELD

The present invention relates to a memory device, a memory system and a microcontroller including a memory device, and a memory control device controlling a memory device. In particular, the present invention relates to a non-volatile memory device such as a flash memory included in a microcontroller.

BACKGROUND

In order to increase the operation speed of a computer system such as a microcontroller, for example, the speed of access to a memory needs to be increased. Memory interleaving is known as a technique of increasing the speed of access to a memory in a system. Based on this memory interleaving technique, a memory having consecutive addresses is divided into a plurality of memories, and the consecutive addresses are accessed in parallel. In this way, the apparent access time can be shortened. In such memory interleaving, if addresses of memory data requested by a single access from the CPU are always included in an address range accessible in parallel, simply divided memories are sufficient. However, if the requested addresses are not completely included in such address range, complex control, such as allocation of an incremented or decremented address to each of the divided memories, is required.

Patent Documents 1 to 4 disclose techniques of acquiring such misaligned data (data having an initial address that does not fall within an address range accessible by a single access) in a single bus cycle. Based on any one of the techniques disclosed in Patent Documents 1 to 4, a memory is divided into a plurality of memories for separately storing upper bits and lower bits, and an address conversion unit for allocating an incremented (or decremented) address to each of the divided memories is included. In this way, since different addresses are given to the upper and lower bit memories, misaligned data can be accessed at once.

On the other hand, FIG. 1 of Patent Document 5 discloses a storage device capable of accessing misaligned data at once, without dividing the memory or including the address conversion unit as disclosed in the above Patent Documents 1 to 4. Compared with Patent Documents 1 to 4, Patent Document 5 uses a simpler configuration to realize equivalent functions. Particularly, since there is no need to divide the memory, a read circuit or a write circuit does not need to be arranged for each of the divided memories. Thus, the storage device according to Patent Document 5 can suitably be formed on a single chip.

According to Patent Document 5, a 1-bit memory cell of a word (i) is connected to two word lines (i) and (i+1) and two bit lines. The two bit lines are used to read/write data when the word lines (i) and (i+1) are selected, respectively. In addition, the word line (i) is shared with memory cells of a word (i−1) and the word line (i+1) is shared with memory cells of a word (i+1). Based on this configuration, by selecting a single word line, memory cells of two consecutive words are selected, and by selecting an upper bit line or a lower bit line, a different address can be selected. Thus, misaligned data can be accessed at once.

Patent Document 1:
Japanese Patent Kokai Publication No. JP-H03-44748A
Patent Document 2:
Japanese Patent Kokai Publication No. JP-H04-359334A
Patent Document 3:
Japanese Patent Kokai Publication No. JP-H05-73406A
Patent Document 4:
Japanese Patent Kokai Publication No. JP-H05-127985A
Patent Document 5:
Japanese Patent Kokai Publication No. JP-S63-308783A

SUMMARY

Each disclosure of the above identified Patent Publications is incorporated herein by reference thereto.

The following analyses are given by the present invention. There is a demand for memory devices and memory systems having not only a higher access speed but also lower power consumption. Particularly, in a microcontroller realizing a computer system in a single integrated circuit, particularly, in a microcontroller incorporating a flash memory, improvement in CPU processing performance and reduction in power consumption are becoming increasingly important design requirements.

Based on a memory circuit according to Patent Document 5, two-word data is read by a single memory access. Thus, compared with a general memory in which one-word data is read by a single memory access, the memory circuit according to Patent Document 5 requires twice as much operating current.

In a first aspect of the present invention, there is provided a memory device that comprises: a plurality of word lines and bit lines specifying addresses to be accessed; and a plurality of memory cells of consecutive addresses arranged to correspond to each of the word lines, the plurality of memory cells of the consecutive addresses being accessible in parallel by the plurality of bit lines each corresponding to one of the memory cells. Among the plurality of word lines, a first word line and a second word line that specifies an address next to that of the first word line have an overlapping address range, and a first memory cell connected to the first word line and a second memory cell connected to the second word line are assigned in dual fashion to a same address.

In a second aspect of the present invention, there is provided a memory system that comprises: the memory device; and a memory control device executing access control on the memory device, wherein, when executing a read operation on the memory device, the memory control device selects and outputs data read from one of the first and second memory cells having the same address.

In a third aspect of the present invention, there is provided a microcontroller comprises: the memory device; a CPU; and a memory control device being controlled by the CPU and accessing the memory device, wherein the memory control device selects data read from one of the first and second memory cells having the same address and outputs the selected data to the CPU.

In a fourth aspect of the present invention, there is provided a memory control device that controls access to a memory device. The memory device comprises a first memory cell included in a plurality of memory cells accessible when a first word line address is selected and a second memory cell included in a plurality of memory cells accessible when a second word line address is selected, the first and second memory cells being assigned in dual fashion to a same and address. When a read address inputted to the memory device includes the address of the first and second memory cells, the memory control device selects data read from one of the first and second memory cells and outputs the selected data.

The meritorious effects of the present invention are summarized as follows.

According to the present invention, a memory device, a memory system, and a microcontroller having low power consumption and high performance can be provided. In addition, a memory control device according to the present invention can easily access the memory device.

PREFERRED MODES

Figure 1:
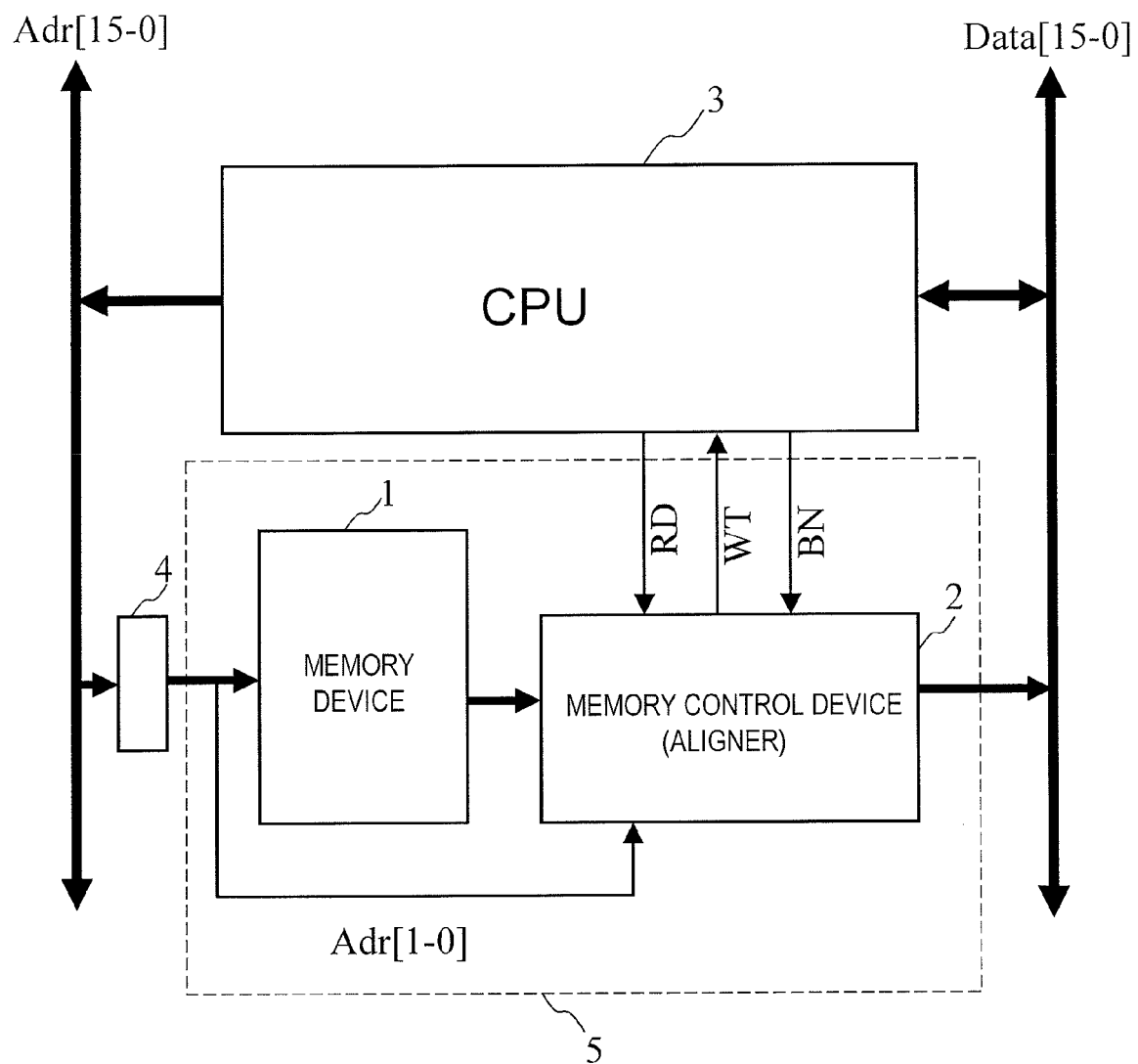
FIG. 1 is a block diagram of a microcontroller using a memory device according to an embodiment of the present invention.

First, outlines of embodiments of the present invention will be described. The drawings and the reference characters thereof referred to in the description of the following outlines are used to illustrate examples of the embodiments. Therefore, variations of the embodiments of the present invention are not limited by the drawings or the reference characters.

Figure 2A:
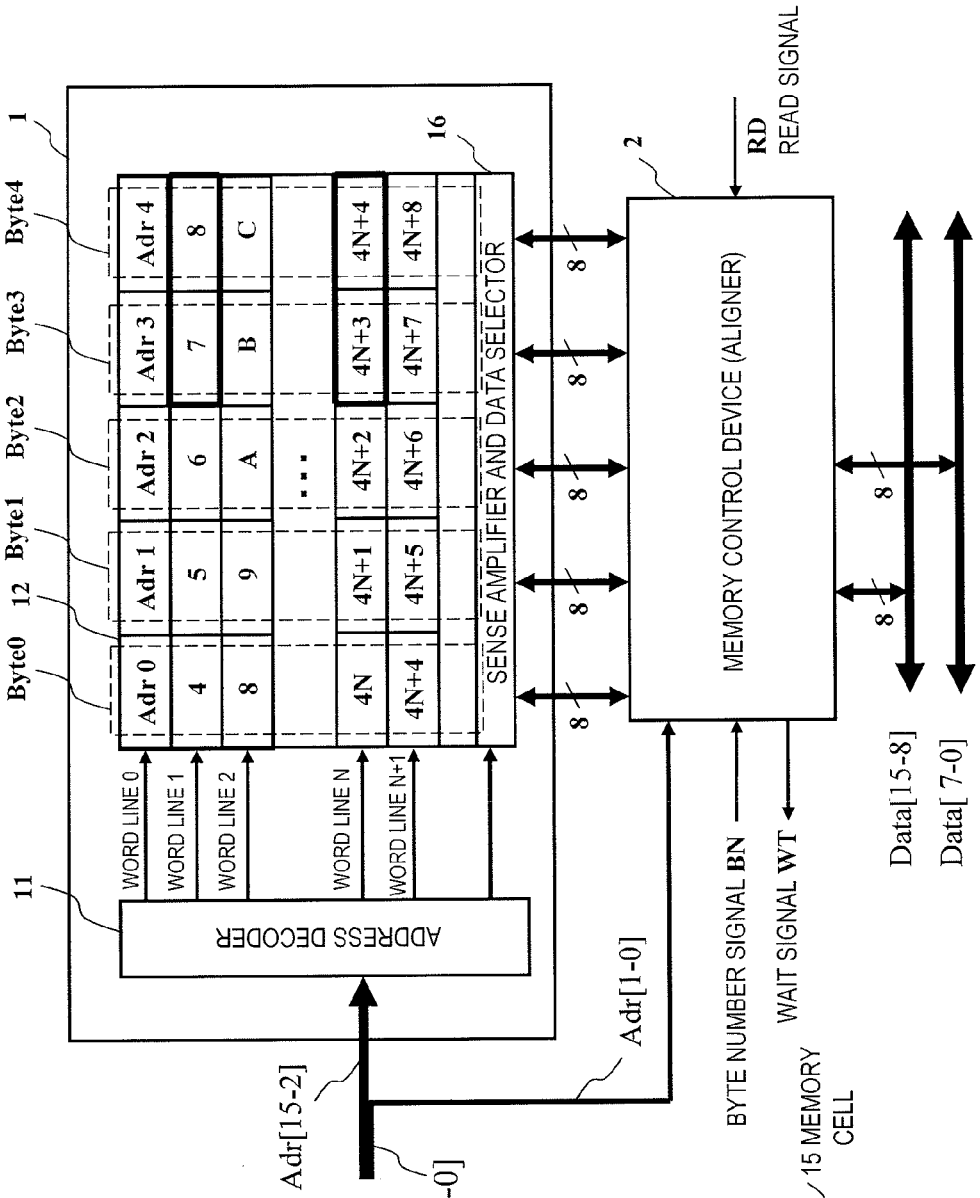
FIGS. 2A and 2B are block diagrams of a memory system and a configuration of a part of a memory cell array according to an embodiment, respectively.
Figure 8:
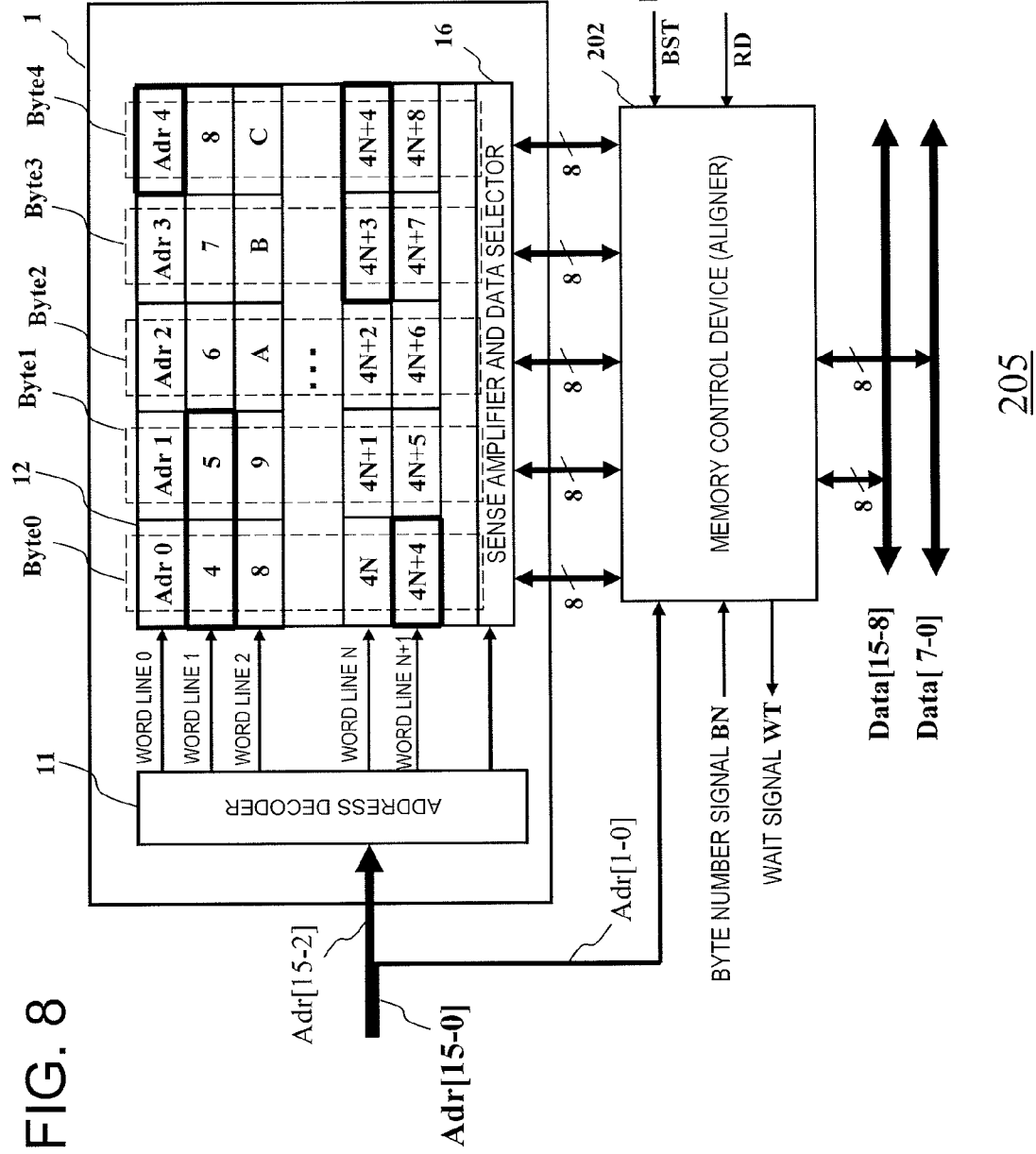
FIG. 8 is a block diagram of a memory system according to another embodiment.

For example, as illustrated in FIGS. 2 and 8, a memory device 1 according to an embodiment of the present invention includes: a plurality of word lines 13 and bit lines 14 specifying addresses to be accessed; and a plurality of memory cells of consecutive addresses (memory cells of addresses 4N to 4N+4) arranged to correspond to each of the word lines (for example, word line N in FIG. 2A), the plurality of memory cells of the consecutive addresses (memory cells of addresses 4N to 4N+4) being accessible in parallel by the plurality of bit lines each corresponding to one of the memory cells. Among the plurality of word lines, a first word line (word line N) and a second word line (word line N+1) that specifies an address next to that of the first word line have an overlapping address range (address 4N+4 overlaps), and a first memory cell (memory cell of Byte4 address 4N+4) connected to the first word line (N) and a second memory cell (memory cell of Byte0 address 4N+4) connected to the second word line (N+1) are assigned in dual fashion to a same address (4N+4). Based on this configuration, conventional misaligned data lying astride a plurality of word line addresses can be accessed by a single access. For example, according to the comparative example of FIG. 5, to read misaligned data stored at the addresses 4N+3 and 4N+4, the memory needs to be read twice. However, according to the above embodiment, such data can be read by a single access to the memory.

In addition, it is preferable that the above memory cells be nonvolatile semiconductor memory cells. Based on the above configuration, identical data needs to be written in two memory cells. However, since the number of read accesses can be reduced, the memory device 1 is suitable when used as a nonvolatile semiconductor memory that is read more often than written.

In addition, for example, as illustrated in FIGS. 2 and 8, a memory system 5 according to an embodiment includes: the above memory device 1; and a memory control device 2 executing access control on the memory device 1. When executing a read operation on the memory device 1, the memory control device 2 selects and outputs data read from one of the first and second memory cells having the overlapping address. Namely, based on the above memory system 5, data can be read at high speed, without considering from which of the memory cells having an overlapping address data needs to be read. More specifically, when a read address and a read data length externally specified indicate that requested data includes an address (4N+4, for example) overlapping between the first and second memory cells, if the requested data further includes an address (4N+3, for example) that is selected by the first word line N and is not selected by the second word line N+1, the memory control device 2 outputs data read from the first memory cell, or if the requested data further includes an address (4N+5, for example) that is selected by the second word line N+1 and is not selected by the first word line N, the memory control device 2 outputs data read from the second memory cell. In this way, even misaligned two consecutive address data can be read by a single access.

In addition, when a burst read operation is executed on the memory device 1, the memory control device does not read one of the first and second memory cells included in a burst read address range. For example, in FIG. 8, when data of four consecutive addresses 4N+2 to 4N+5 is burst read, the memory control device does not read data of the address 4N+4 connected to the word line N. Thus, the current consumption can be reduced.

Figure 7:
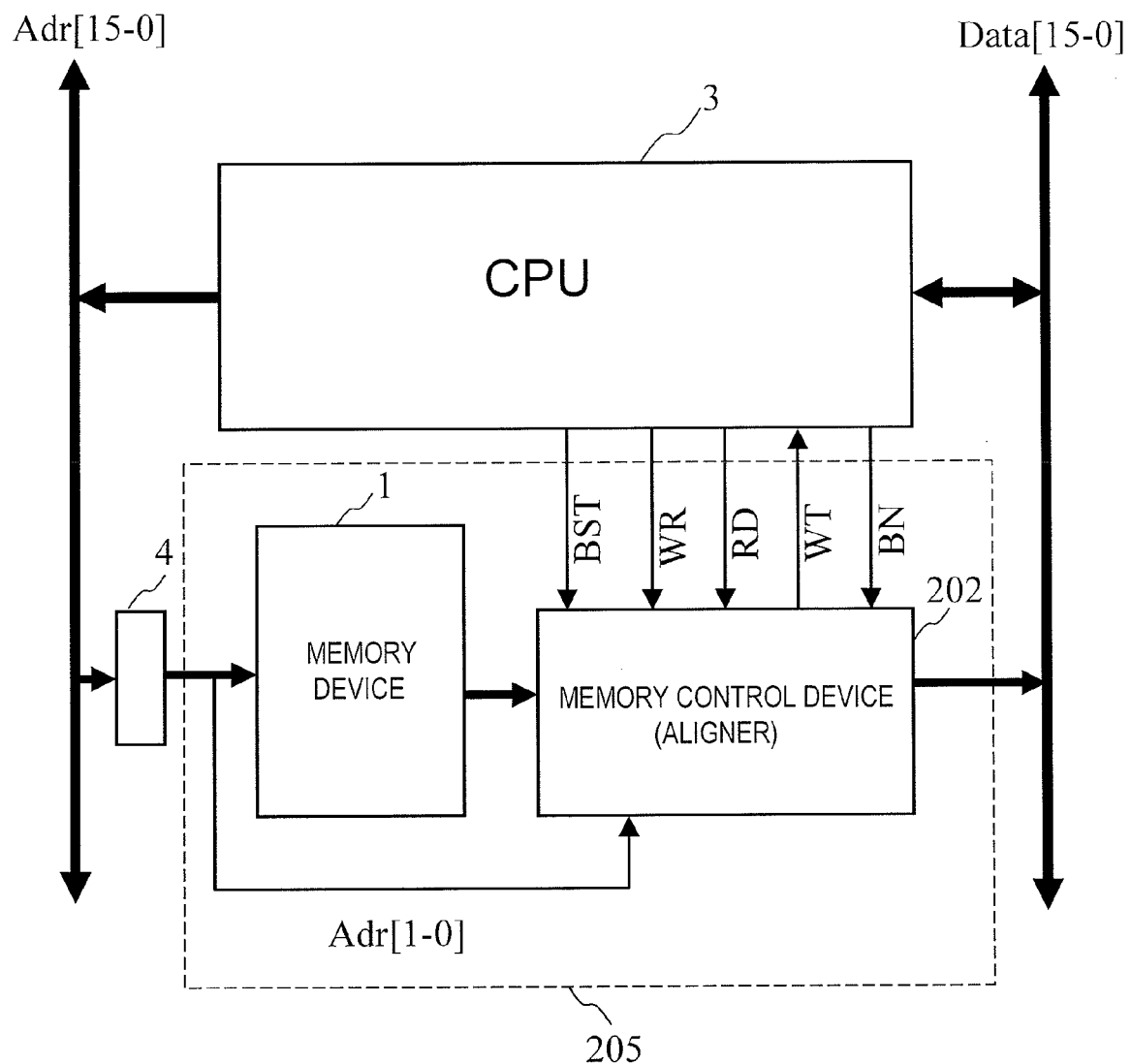
FIG. 7 is a block diagram of a microcontroller according to another embodiment.

In addition, as illustrated in FIGS. 1 and 7, a microcontroller according to an embodiment includes: the above memory device 1; a CPU 3; and a memory control device 2 being controlled by the CPU 3 and accessing the memory device 1, wherein the memory control device 2 selects data read from one of the first and second memory cells having the same address and outputs the selected data to the CPU 3.

In addition, based on the above microcontroller, assuming that the number of consecutive addresses readable in parallel from the memory device 1 when one of the plurality of word lines is selected is n, the CPU 3 and the memory control device 2 are connected to each other by a data bus Data[15-0] having a bit width capable of transferring m ($1<m<n$) address data in parallel, and an (m−1) address memory cell(s) overlap(s) between the selected word line and another word line specifying a neighboring address. For example, in FIGS. 2 and 8, since n=5 and m=2, a memory cell of one address overlaps between the word lines N and N+1. Since the (m−1) overlapping address(es) is(are) arranged, regardless of the initial address of data, data transferable by a single transfer via the data bus can be read by a single access.

In addition, the memory control device 2 according to an embodiment controls access to the memory device 1. The memory device 1 includes a first memory cell (4N+4)

included in a plurality of memory cells accessible when a first word line address (selection address of the word line N) is selected and a second memory cell (4N+4) included in a plurality of memory cells accessible when a second word line address (selection address of the word line N+1) is selected, the first and second memory cells being assigned in dual fashion to a same address. When a read address inputted to the memory device 1 includes the address of the first and second memory cells, the memory control device 2 selects data read from one of the first and second memory cells and outputs the selected data. Outlines of embodiments have thus been described. Next, each embodiment will be described in detail with reference to the drawings.

Embodiment 1

[Configuration of Embodiment 1]

FIG. 1 is a block diagram of a microcontroller according to embodiment 1. The microcontroller in FIG. 1 includes a CPU 3, a memory device 1 storing programs and data executed by the CPU 3, and a memory control device (aligner) 2 aligning data and programs read from the memory device 1 and outputting the aligned data and programs to the CPU 3. The memory device 1 and the memory control device 2 constitute a memory system 5, and the CPU 3 can access the memory system 5 as a single system, rather than separately as the memory device 1 and the memory control device 2.

The CPU 3 and the memory control device 2 are connected to each other via a 16-bit data bus Data[15-0]. The memory control device 2 reads data from the memory device 1 and aligns the data based on a byte number requested by the CPU 3. The memory control device 2 then outputs the aligned data to the data bus Data[15-0]. The CPU 3 is connected to a 16-bit address bus Adr[15-0], which is also connected to an address latch 4. The address latch 4 latches an address outputted from the CPU 3 and supplies the latched address to the memory device 1. Lower two bits Adr[1-0] of the address latched by the address latch 4 is also supplied to the memory control device 2.

In addition, a read signal RD and a byte number signal BN are supplied from the CPU 3 to the memory control device 2, and a wait signal WT is supplied from the memory control device 2 to the CPU 3. The read signal RD becomes active (high level) when the CPU 3 reads data from the memory device 1. The byte number signal BN specifies the length (byte number) of data read from the CPU 3 to the memory 1. The CPU 3 handles 1-byte data or 2-byte data and uses the logic level of the byte number signal BN, thereby requesting the memory control device 2 to read 1-byte data or 2-byte data. Further, when data requested by the CPU 3 cannot be prepared by the next bus cycle, the memory control device 2 supplies the wait signal WT to the CPU 3 to bring the CPU 3 in a wait state. When the memory control device 2 outputs a high-level (active) wait signal WT, the CPU 3 is brought in a wait state.

When reading data stored in the memory device 1, the CPU 3 specifies an address in the memory device 1 and the bit number signal BN in accordance with a requested data length (1 byte or 2 byte). In addition, the CPU 3 outputs an initial address in the memory device 1 to be read to the address bus Adr[15-0] and brings the read signal RD to a high level. In this way, the CPU 3 requests the memory control device 2 to read and transfer data from the memory device 1. The memory control device 2 reads data from the memory device 1 and aligns the data based on the data length specified by the byte number signal BN. The memory control device 2 next outputs the aligned data to the CPU 3. If the memory control device 2 cannot complete reading of data corresponding to the address requested by the CPU 3 from the memory device 1 by a predetermined cycle, the memory control device 2 brings the wait signal WT to a high level. In this way, execution of instructions by the CPU 3 is stopped until the data read from the memory device 1 can be prepared.

Figure 2B:
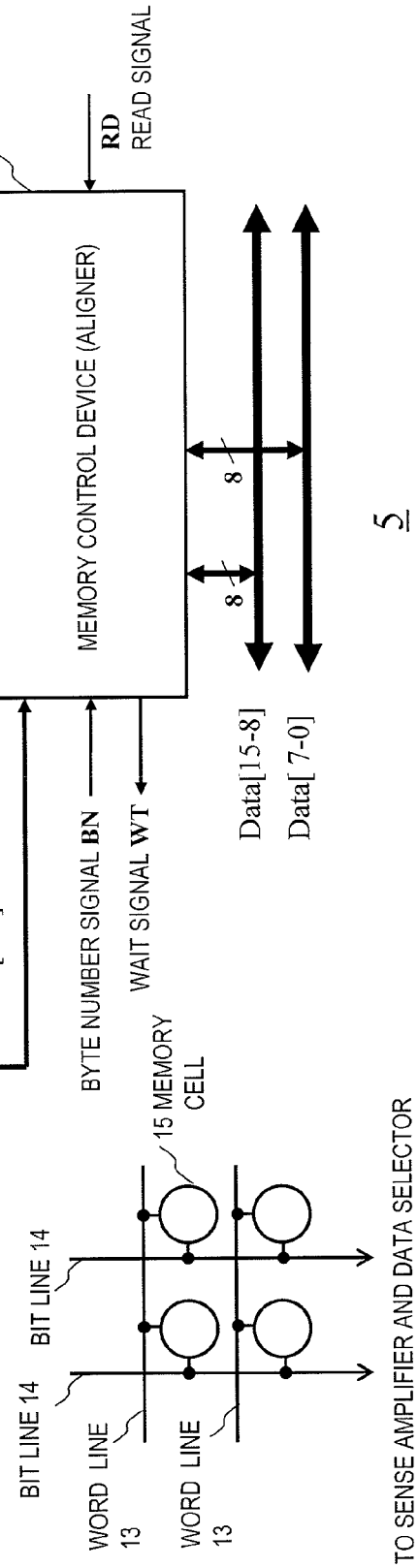

FIG. 2A is a block diagram of an internal configuration of the memory device 1 in the memory system 5. FIG. 2B is a block diagram of a configuration of a part of a memory cell array 12 in the memory device 1.

In FIG. 2A, the memory device 1 includes: an address decoder 11 decoding upper address bits Adr[15-2] of the 16-bit address Adr[15-0] latched by the address latch 4; the memory cell array 12; and a sense amplifier and data selector 16. Word lines 0 to N+1 are connected from the address decoder 11 to the memory cell array 12.

As illustrated in FIG. 2B, in the memory cell array 12, a plurality of bit lines 14 are arranged in a direction perpendicular to a plurality of word lines 13 (identical to the word lines 0 to N+1 in FIG. 2A). Each of the bit lines 14 is connected to the sense amplifier and data selector 16. In addition, the memory cell array 12 includes memory cells 15 each at the intersection of a word line 13 with a bit line 14.

Referring back to FIG. 2A, each of the word lines 0 to N+1 is connected to memory cells of consecutive 5-byte addresses from Byte0 to Byte4. The memory cell of an initial address (Byte0) of the 5-byte memory cells connected to each word line and the memory cell of a final address (Byte4) of the 5-byte memory cells connected to a word line of the preceding address have an overlapping address. In addition, the memory cell of a final address (Byte4) of the 5-byte memory cells connected to each word line and the memory cell of an initial address (Byte0) connected to a word line of the following address have an overlapping address.

More specifically, the word line N is connected to 5-byte memory cells of consecutive addresses Adr4N to Adr4N+4. Likewise, the word line N+1 specifying the address following that of the word line N, is connected to 5-byte memory cells of consecutive addresses Adr4N+4 to Adr4N+8. Namely, the Byte4 memory cell connected to the word line N and the Byte0 memory cell connected to the word line N+1 have the same address Adr4N+4. Thus, a plurality of memory cells are arranged in dual fashion at the same address.

Likewise, the memory cell of the fifth and final address Adr4 (Byte4) connected to the word line 0 and the memory cell of the initial address Adr4 (Byte0) connected to the word line 1 specifying the address following that of the word line 0 have an overlapping address. The memory cell of the fifth and final address Adr8 (Byte4) connected to the word line 1 and the memory cell of the initial address Adr8 (Byte0) connected to the word line 2 specifying the address following that of the word line 1 have an overlapping address. While not illustrated in FIG. 2A, memory cells having addresses AdrC and Adr4N+8 are also arranged in dual fashion. Namely, in FIG. 2A, the memory cell of the fifth and final address (Byte4) connected to a word line specifying an arbitrary address and the memory cell of the first and initial address (Byte0) connected to the word line specifying an address that immediately follows the arbitrary address are arranged in dual fashion.

In this memory system 5, when the CPU 3 specifies the address Adr[15-0] and activates the read signal RD, the address decoder 11 selects a single word line based on a value of the upper address bits Adr[15-2], and the memory control device 2 reads 5-byte (5×8=40 bits) consecutive address data from memory cells of the memory cell array 12 connected to the selected word line via the sense amplifier and data selector 16. The memory control device 2 selects 1-byte or 2-byte data of the 5-byte data read from the memory device 1 based on the lower address bits Adr[1-0] and the logic level of the byte number signal BN specified by the CPU 3 in the preceding clock cycle. The memory control device 2 then outputs the selected 1-byte or 2-byte data to the data bus Data[15-0].

[Operation of Embodiment 1]

Figure 3A:
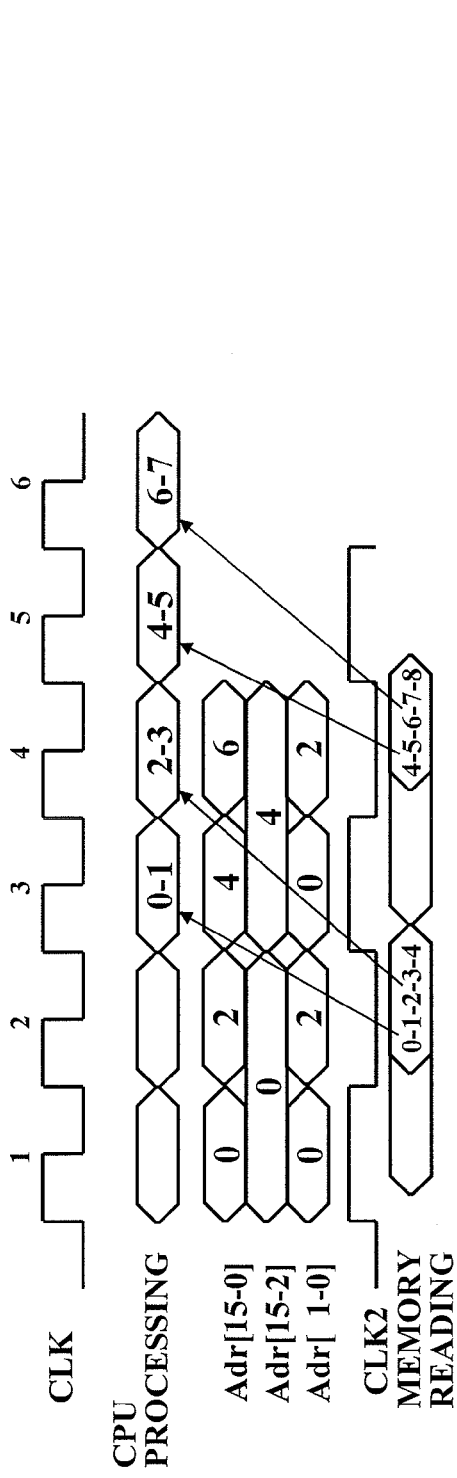
FIGS. 3A and 3B are read timing diagrams according to an embodiment when misalignment is not caused and when misalignment is caused, respectively.

Next, an operation of reading data from the memory system 5 in the microcontroller of FIG. 1 will be described, assuming that data is already written in each of the memory cells of the memory device 1 in FIG. 2 (in particular, identical data is already written in memory cells having an overlapping address). FIG. 3A is a read timing diagram when addresses are not misaligned. In FIG. 3A, CLK represents a system clock, which is an operation clock of the CPU 3.

In clock cycle 1 of the system clock, the memory device 1 inputs an address 0000H (hereinafter, H at the end of an address represents that the address is given in hexadecimal) from the CPU 3, and the memory device 1 starts a read operation.

In clock cycle 2, the memory control device 2 reads 5-byte data of consecutive addresses including the address 0000H as an initial address from the memory device 1. Based on the byte number signal BN (2 bytes in this case) and the lower address bits Adr[1-0] (0H in this case) specified by the CPU 3 in clock cycle 1, the memory control device 2 sends the initial 2-byte data (addresses 0000H and 0001H) of the read 5-byte data to the CPU 3 via the data bus Data[15-0].

In clock cycle 3, the next address 0004H is inputted from the CPU 3, and the memory device 1 starts the next read operation. The CPU 3 processes the 2-byte data of addresses 0000H and 0001H sent from the memory control device 2. Further, based on the byte number signal BN (2 bytes in this case) and the lower address bits Adr[1-0] (2H in this case) specified by the CPU 3 in clock cycle 2, the memory control device 2 sends the 2-byte data of the addresses 0002H and 0003H to the CPU 3.

In clock cycle 4, the CPU 3 processes the 2-byte data of the addresses 0002H and 0003H sent from the memory control device 2. Further, the memory control device 2 reads 5-byte data of consecutive addresses including the address 0004H as an initial address from the memory device 1. Based on the byte number signal BN (2 bytes in this case) and the lower address bits Adr[1-0] (0H in this case) specified by the CPU 3 in clock cycle 3, the memory control device 2 sends 2-byte data of the addresses 0004H and 0005H to the CPU 3.

Namely, when the CPU 3 requests the memory device 1 to read 2-byte data, if the initial address of the 2-byte data is an even number, no address misalignment is caused. Thus, among the 5-byte data of a single word stored in the memory device 1, the final 1-byte (Byte4) data is not used.

Figure 3B:
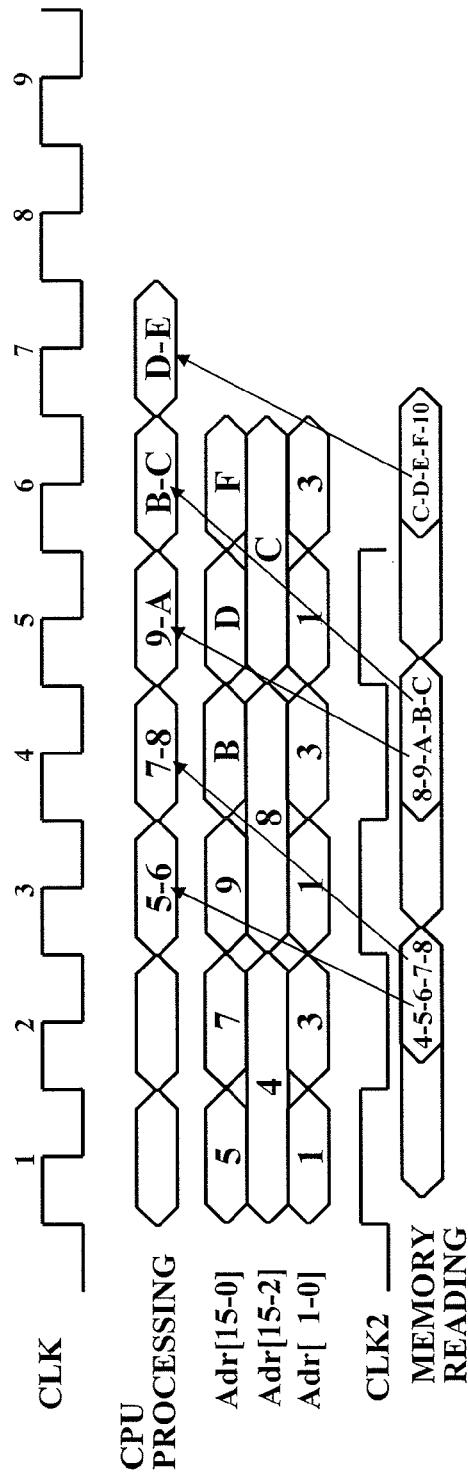

Next, FIG. 3B is a read timing diagram when addresses are misaligned. In the present embodiment, the CPU 3 outputs addresses 0005H, 0007H, 0009H, and 000BH in clock cycles 1 to 4, respectively, and the byte number signal BN specifies two bytes during these four clock cycles. In clock cycle 1, the memory device 1 inputs the address 0005H from the CPU 3, and the memory device 1 starts a reading operation.

In clock cycle 2, the memory control device 2 reads 5-byte (addresses 0004H to 0008H) data of consecutive addresses including the address 0004H as an initial address from the memory device 1. Based on the byte number signal BN (2 bytes in this case) and the lower address bits Adr[1-0] (1H in this case) specified by the CPU 3 in clock cycle 1, the memory control device 2 sends the 2-byte data of the address 0005H and 0006H of the read 5-byte data to the CPU 3 via the data bus Data[15-0].

In clock cycle 3, the next address 0009H is inputted from the CPU 3, and the memory device 1 starts the next reading operation. The CPU 3 processes the 2-byte data of the addresses 0005H and 0006H sent from the memory control device 2. Further, based on the byte number signal BN (2 bytes in this case) and the lower address bits Adr[1-0] (3H in this case) specified by the CPU 3 in clock cycle 2, the memory control device 2 sends the 2-byte data of the addresses 0007H and 0008H to the CPU 3.

In clock cycle 4, the CPU 3 processes the 2-byte data of the addresses 0007H and 0008H sent from the memory control device 2. Further, the memory control device 2 reads 5-byte data (addresses 0008H to 000CH) of consecutive addresses including the address 0008H as an initial address from the memory device 1. Based on the byte number signal BN (2 bytes in this case) and the lower address bits Adr[1-0] (1H in this case) specified by the CPU 3 in clock cycle 3, the memory control device 2 sends the 2-byte data of the addresses 0009H and 000AH to the CPU 3.

As represented by the operation in clock cycle 3, when the CPU 3 requests the memory device 1 to read 2-byte data, if the initial address of the 2-byte data is an odd number, address misalignment is caused. Thus, since the final 1-byte data of the 5-byte data of a single word stored in the memory device 1 and the initial-byte data connected to a word line of the following address have an overlapping address, the final 1-byte data is used. The initial-byte data is not transferred to the CPU 3.

When the memory control device 2 is requested by the CPU 3 to read 2-byte data of consecutive addresses, if one of the 2-byte addresses is an address at which memory cells are arranged in dual fashion, a word line to which a memory cell that does not have an overlapping address of the 2-byte addresses is connected is selected. The memory control device 2 then reads the 2-byte data from the selected word line. For example, in FIG. 2A, when 2-byte data of the addresses 0007H and 0008H is read, the memory cell of the address 0008H is arranged in dual fashion to the word line 1 (Byte4) and to the word line 2 (Byte0). However, since the memory cell of the address 0007H is arranged to the word line 1 alone, the memory control device 2 selects the word line 1 having the smaller address and reads the 2-byte data of the addresses 0007H and 0008H from the word line 1 at once. On the other hand, when 2-byte data of the addresses 0008H and 0009H is read, the memory cell of the address 0008H is arranged in dual fashion to the word line 1 (Byte4) and to the word line 2 (Byte0). However, since the memory cell of the address 0009H is arranged to the word line 2 alone, the memory control device 2 selects the word line 2 and reads the 2-byte data of the addresses 0008H and 0009H from the word line 2 at once. The memory control device 2 can determine which one of the memory cell data having an overlapping address to be read and transferred to the CPU 3, based on the lower two bits Adr[1-0] of the address and the byte number signal BN specified by the CPU 3.

Namely, based on the memory device 1 according to embodiment 1, when the CPU 3 requests the memory device 1 to read 2-byte data, even if addresses are misaligned, since the initial address (Byte0) and the final address (Byte4) of the addresses selected when a single word line is selected overlap with those selected when other word lines are selected, consecutive 2-byte data can always be read by selecting a single word line. Namely, there is no need to select another word line and read data from the memory device 1 twice. Thus, the CPU 3 can read data from the memory device 1 at high speed.

Based on an operation of the microcontroller, the memory control device 2 can always read consecutive address data transferable by a single data transfer via the data bus with a single access to the memory device 1. While this operation will be hereinafter described, the following description is made based on the assumption that the number of consecutive addresses readable from the memory device 1 in parallel by selection of a single word line is n and that the CPU 3 and the memory control device 2 are connected to a data bus having a bit width capable of transferring m-address data in parallel. If an (m−1) address memory cell(s) of the above n addresses and a memory cell(s) connected to a word line specifying the preceding/following address have an overlapping address, even if addresses are misaligned, by selecting a single word line, the memory control device 2 can read consecutive address data transferable by a single data transfer via the data bus. In order to cause the memory control device 2 to read such data transferable by a single data transfer with a single access to the memory device 1, the number n needs to be larger than the number m (m<n). In addition, the number m is a plural number. In the above embodiment, since n=5 and m=2, a single address overlaps between word lines (m−1=1). Namely, the memory cells of two neighboring word lines have only one overlapping address (byte).

COMPARATIVE EXAMPLE

Figure 4:
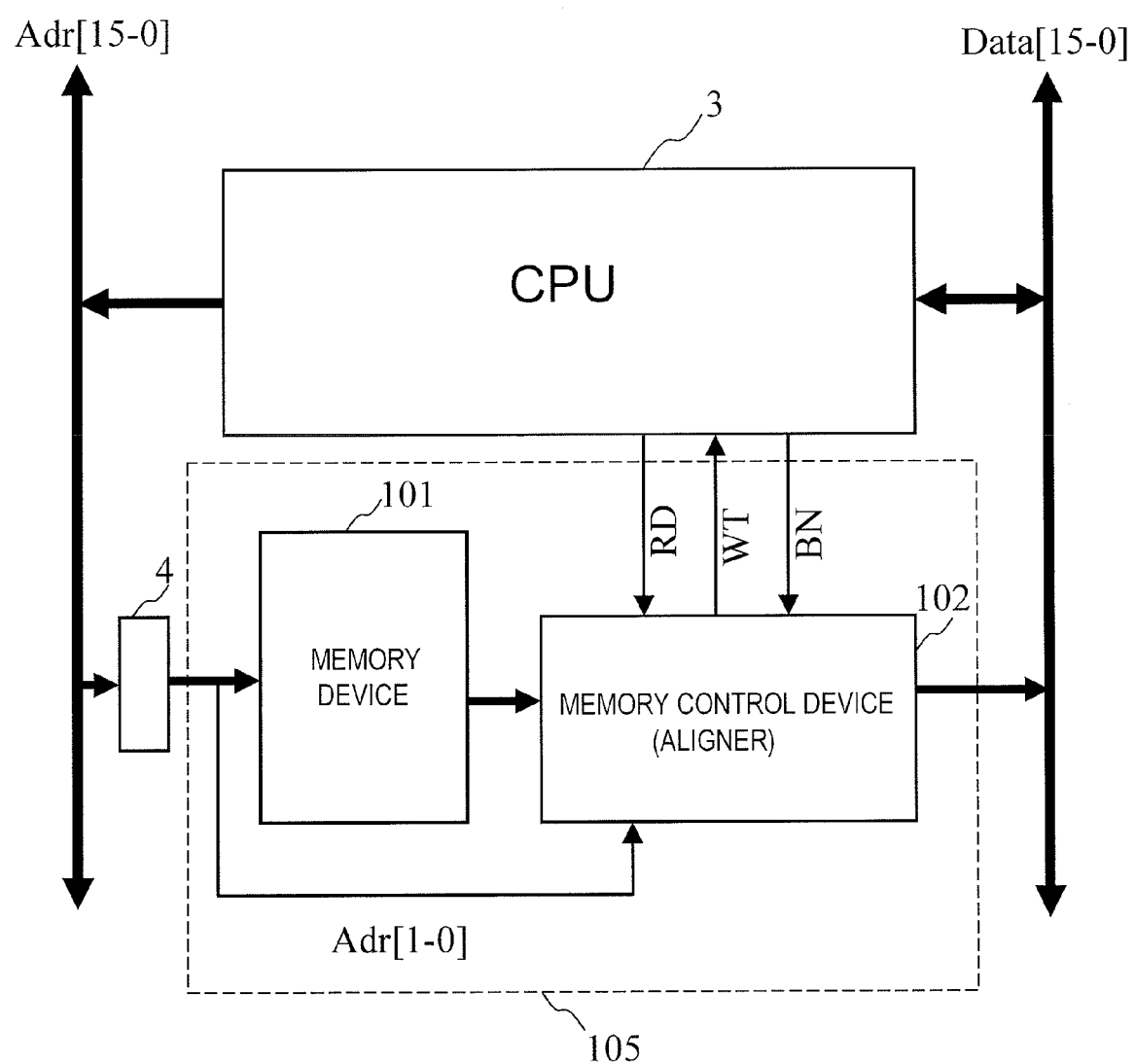
FIG. 4 is a block diagram of a microcontroller according to a comparative example.

FIG. 4 is a block diagram of a microcontroller according to a comparative example, which will be compared with embodiment 1. The microcontroller according to this comparative example in FIG. 4 has the same configuration as that of the microcontroller according to embodiment 1 in FIG. 1, except that the memory device 1, the memory control device 2, and the memory system 5 are replaced with a memory device 101, a memory control device 102, and a memory system 105, respectively. Unlike the memory device 1 in FIG. 1, in the memory device 101 in FIG. 4, an overlapping address is not arranged between word lines. Thus, unlike the memory control device 2 of embodiment 1, the memory control device 102 does not have a function of, for example, determining which memory cell data of an overlapping address should be transferred.

Figure 5:
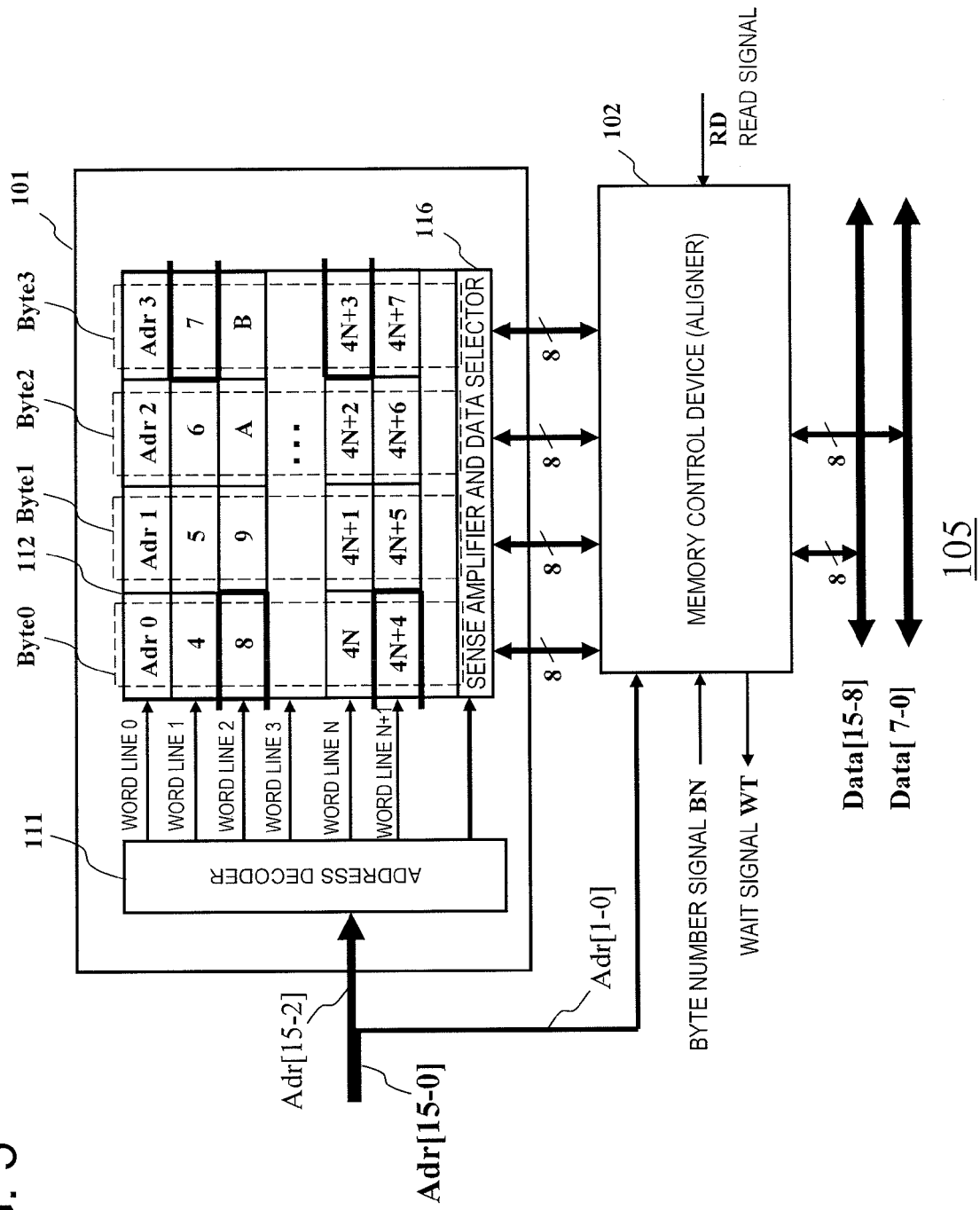
FIG. 5 is a block diagram of a memory system according to a comparative example.

FIG. 5 is a block diagram of an internal configuration of the memory device 101 in the memory system 105. Unlike the memory device 1 according to embodiment 1, in the memory device 101, memory cells connected to bit lines specifying consecutive addresses do not have an overlapping address. More specifically, while memory cells of consecutive 5-byte addresses (Byte0 to Byte4) are connected to a single word line in the memory device 1 according to embodiment 1, memory cells of consecutive 4-byte addresses (Byte0 to Byte3) are connected to a single word line in the memory device 101 according to the comparative example.

Figure 6A:
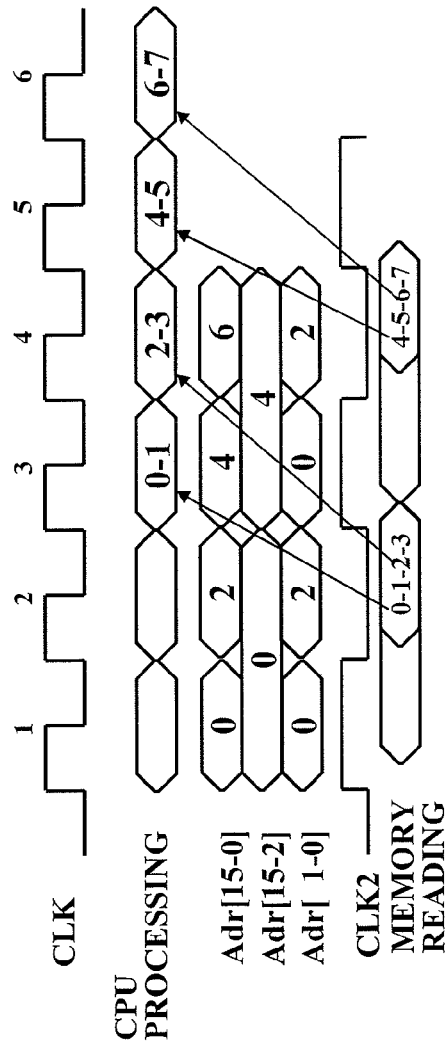
FIGS. 6A and 6B are read timing diagrams according to a comparative example when misalignment is not caused and when misalignment is caused, respectively.
Figure 6B:
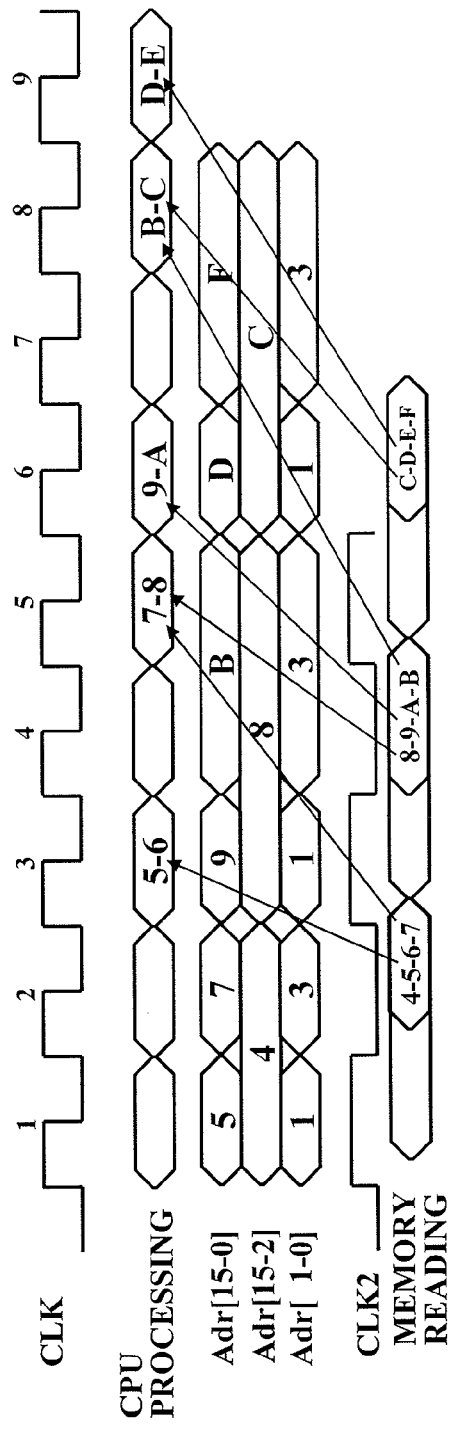

Next, an operation according to the comparative example will be described. FIG. 6A is a read timing diagram according to the comparative example when misalignment is not caused. FIG. 6B is a read timing diagram according to the comparative example when misalignment is caused. In FIG. 6A, basic operation timings are similar to those according to embodiment 1 in FIG. 3A. Only the difference between FIGS. 3A and 6A is that, while consecutive 5-byte data (Byte0 to Byte4) is read from the memory device 1 in FIG. 3A, consecutive 4-byte data (Byte0 to Byte3) is read from the memory device 101 in FIG. 6A.

However, when address misalignment is caused, the operation according to the comparative example differs more significantly from that according to embodiment 1. In FIG. 6B, since the operation up to clock cycle 2 is the same as that according to embodiment 1 in FIG. 3B, the operation in and after clock cycle 3 will be described. In FIG. 6B, in clock cycle 3, the next address 0009H is inputted from the CPU 3, and the memory device 101 starts the next read operation. The CPU 3 processes the 2-byte data of the addresses 0005H and 0006H sent from the memory control device 102. Further, based on the byte number signal BN (2 bytes in this case) and the lower address bits Adr[1-0] (3H in this case) specified by the CPU 3 in clock cycle 1, the memory control device 102 attempts to send data of the addresses 0007H and 0008H to the CPU 3. However, since the data of the address 0008H has not been read yet from the memory device 101, the memory control device 102 cannot send the 2-byte data of the addresses 0007H and 0008H to the CPU 3. Thus, the memory control device 102 activates the wait signal WT in the next clock cycle 4 and waits for the data to be read from the memory device 1.

In clock cycle 4, 4-byte data of addresses 0008H to 000BH is read from the memory device 101. Since the wait signal WT is active, the CPU 3 stops its processing while requesting the memory control device 102 to read 2-byte data through the byte number signal BN. In clock cycle 5, the memory control device 102 sends the 2-byte data of the addresses 0007H and 0008H to the CPU 3 and inactivates the wait signal WT.

In clock cycle 6, the memory control device 102 sends 2-byte data of addresses 0009H and 000AH to the CPU 3. When the CPU 3 inputs an address 000DH, in the memory device 101, a word line 3 connected to memory cells corresponding to addresses 000CH to 000FH is selected, and the selected memory cells start to be read. In clock cycle 7, since data of the address 000CH has not been read yet from the memory device 101, the memory control device 102 cannot send the 2-byte data corresponding to the addresses 000BH and 000CH to the CPU 3. Thus, in clock cycle 7, the memory control device 102 activates the wait signal WT and waits for the data to be read from the memory device 101, and accordingly, the CPU 3 stops its processing. In clock cycle 8, since the 4-byte data of the addresses 000CH to 000FH is read from the memory device 101, the memory control device 102 inactivates the wait signal WT and sends the data of the addresses 000BH and 000CH to the CPU 3.

Namely, according to the comparative example, when the CPU 3 requests the memory control device 102 to read data having a length of two or more bytes, if the data does not fall within an address range selected when a single word line is selected, that is, if the two or more byte data requested by the CPU 3 lies astride two word lines, the memory device 101 needs to be read twice, and until then, the CPU 3 needs to stop its processing. As a result, the throughput is decreased. FIG. 6B indicates that, when consecutively reading 2-byte data that starts with an odd-numbered address, the CPU 3 repeats operations of two clock cycles and a stop of one clock cycle.

Further, since both the number of memory cells connected to a word line and the number of bit lines according to embodiment 1 are 5/4 of those according to the comparative example, the power consumption of the memory device 1 may be increased up to approximately 5/4 of that according to the comparative example. However, according to embodiment 1, even when misalignment is consecutively caused, the apparent access speed to the memory device 1 is not decreased. In contrast, as illustrated in FIG. 6B according to the comparative example, when misalignment is consecutively caused, the apparent access speed from the memory device 1 is decreased to 2/3 of the access speed according to embodiment 1. Thus, when misalignment is consecutively caused, processing performance of the CPU 3 according to the comparative example is decreased to 2/3 of that of the CPU 3 according to embodiment 1. Under these conditions, the ratio of performance of the CPU 3 to power (performance-to-power ratio) is compared between embodiment 1 and the comparative example. The performance-to-power ratio is used to represent CPU performance per unit power and is expressed in the unit MIPS/W. A higher performance-to-power ratio indicates a higher CPU performance. Assuming that the power consumption according to the comparative example is 1, the power consumption according to embodiment 1 is 5/4. However, assuming that the CPU performance according to the comparative embodiment 1 is 1, the CPU performance according to embodiment 1 is 3/2. Namely, assuming that the performance-to-power ratio according to the comparative example is 1, since the performance-to-power ratio according to embodiment 1 is 1.2, it is clear that the present invention provides a significant meritorious effect.

Embodiment 2

FIG. 7 is a block diagram of a microcontroller according to embodiment 2. A basic configuration of the microcontroller in FIG. 7 is identical to that of the microcontroller according to embodiment 1 in FIG. 1. However, in addition to the functions according to embodiment 1, a memory control device 202 of the microcontroller according to embodiment 2 further includes a function of accommodating a burst read operation. Thus, embodiment 2 is different from embodiment 1 in that the CPU 3 supplies a burst signal BST to the memory control device 202. FIG. 8 is a block diagram of an internal configuration of the memory device 1 in a memory system 205 according to embodiment 2. This memory system 205 of FIG. 8 according to embodiment 2 is different from the memory system 5 of FIG. 2A according to embodiment 1 in that the memory control device 202 is supplied with the burst signal BST.

[Burst Read Operation]

According to embodiment 2, when the read signal RD and the burst signal BST are activated and a write signal WR is inactivated, the CPU 3 can execute a burst read operation. When a burst read operation is set, if an address range specified by the burst read operation includes memory cells having an overlapping address, the memory control device 202 only reads one of the memory cells. For example, in FIG. 8, when executing a burst read operation on addresses 0 to 4N+7, the memory control device 202 does not read the final address (Byte4) of each word line; that is, the memory control device 202 does not read the addresses 4, 8, C, . . . 4N+4.

As described above, the memory device 1 does not execute a read operation itself on one of each pair of memory cells having an overlapping address, let alone output the data read therefrom to the data bus. Thus, the power consumption during a burst read operation can be reduced.

In the above embodiments 1 and 2, a method of writing data in the memory device 1 is not described. However, if the memory device 1 is supplied with an address conversion circuit capable of allocating different addresses to memory cells having an overlapping address during writing, no particular problem is caused. For example, when the memory data is fixed data that is written at the time of manufacture and that does not need to be rewritten subsequently, if writing is executed statically with a flash ROM writer, an LSI tester, or the like, the addresses may be converted to execute writing. If the memory device 1 is a read-only memory (ROM) or the like, writing is unnecessary.

Based on the configuration described above, in the microcontroller including a flash memory, even when addresses are misaligned, data can be read by the same number of accesses as that required when addresses are aligned. Thus, reading of misaligned data does not hinder high-speed processing.

It should be noted that other objects, features and aspects of the present invention will become apparent in the entire disclosure and that modifications may be done without departing from the gist and scope of the present invention as disclosed herein and claimed as appended herewith. Also it should be noted that any combination or selection of the disclosed and/or claimed elements, matters and/or items may fall under the modifications aforementioned.

What is claimed is:

1. A memory system comprising:
a memory device comprising:
    a plurality of word lines and bit lines specifying addresses to be accessed; and
    a plurality of memory cells of consecutive addresses arranged to correspond to each of the word lines, the plurality of memory cells of the consecutive addresses being accessible in parallel by the plurality of bit lines each corresponding to one of the memory cells,
    wherein, among the plurality of word lines, a first word line and a second word line that specifies an address next to that of the first word line have an overlapping address range, and a first memory cell connected to the first word line and a second memory cell connected to the second word line are assigned in dual fashion to a same address; and
a memory control device executing access control on the memory device,
    wherein, when executing a read operation on the memory device, the memory control device selects and outputs data read from one of the first and second memory cells having the same address, and
    wherein, when a read address and a read data length externally specified indicate that requested data includes an address overlapping between the first and second memory cells, if the requested data further includes an address that is selected by the first word line and is not selected by the second word line, the memory control device outputs data read from the first memory cell, or if the requested data further includes an address that is selected by the second word line and is not selected by the first word line, the memory control device outputs data read from the second memory cell.

2. A memory control device controlling access to a memory device comprising a first memory cell included in a plurality of memory cells accessible when a first word line address is selected and a second memory cell included in a plurality of memory cells accessible when a second word line address is selected, the first and second memory cells being assigned in dual fashion to a same address,
    wherein, when a read address inputted to the memory device includes the address of the first and second memory cells, the memory control device selects data read from one of the first and second memory cells and outputs the selected data, and
    wherein, when a read address and a read data length externally specified indicate that requested data includes the same address assigned to the first and second memory cells, if the requested data further includes an address that is selected by the first word line address and is not selected by the second word line address, the memory control device outputs data read from the first memory cell, or if the requested data further includes an address that is selected by the second word line address and is not selected by the first word line address, the memory control device outputs data read from the second memory cell.

* * * * *